(12) United States Patent
Neusch et al.

(10) Patent No.: US 8,540,850 B2
(45) Date of Patent: Sep. 24, 2013

(54) TARGET ARRANGEMENT FOR MOUNTING / DISMOUNTING AND METHOD OF MANUFACTURING

(75) Inventors: Marcel Neusch, Seuzach (CH); Peter Schlegel, Maienfeld (CH); Hartmut Rohrmann, Schriesheim (DE); Oliver Rattunde, Werdenberg (CH)

(73) Assignee: OC Oerlikon Balzers AG, Balzers (LI)

( * ) Notice: Subject to any disclaimer, the term of this patent is extended or adjusted under 35 U.S.C. 154(b) by 757 days.

(21) Appl. No.: 11/639,034

(22) Filed: Dec. 14, 2006

(65) Prior Publication Data
US 2007/0144899 A1   Jun. 28, 2007

(30) Foreign Application Priority Data

Dec. 23, 2005   (EP) ..................................... 05028296

(51) Int. Cl.
*C23C 14/00* (2006.01)
(52) U.S. Cl.
USPC ................................ 204/192.12; 204/298.12
(58) Field of Classification Search
USPC ........................... 204/298.12, 298.13, 192.12
See application file for complete search history.

(56) References Cited

U.S. PATENT DOCUMENTS

| | | | | |
|---|---|---|---|---|
| 5,512,150 | A | * | 4/1996 | Bourez et al. ............... 204/192.2 |
| 5,529,673 | A | | 6/1996 | Strauss et al. |
| 5,616,226 | A | | 4/1997 | Kunz et al. |
| 5,674,367 | A | | 10/1997 | Hunt et al. |
| 6,068,742 | A | | 5/2000 | Daxinger et al. |
| 2003/0146084 | A1 | | 8/2003 | Fu |
| 2003/0183506 | A1 | * | 10/2003 | Ivanov et al. ............ 204/192.13 |

FOREIGN PATENT DOCUMENTS

| | | | | |
|---|---|---|---|---|
| JP | 62074074 | A | * | 4/1987 |
| JP | 06136533 | A | * | 5/1994 |

OTHER PUBLICATIONS bias. (n.d.) The American Heritage® Dictionary of the English Language, Fourth Edition. (2003). Retrieved Dec. 11, 2012 from http://www.thefreedictionary.com/bias.*

* cited by examiner

*Primary Examiner* — John Brayton
(74) *Attorney, Agent, or Firm* — Notaro, Michalos & Zaccaria P.C.

(57) ABSTRACT

So as to provide a target arrangement with improved mounting and dismounting ability, the target arrangement comprises a plate along a plane (E) which has a border (7) defined by a first wedge surface ($5_u$) angled to the addressed general plane (E) and a second wedge surface ($5_l$) which is substantially planar as well and angled with respect to the generic plane (E). The two wedge surfaces mutually convert in a direction along the addressed plane (E) and from a more central area of the plate outwardly.

12 Claims, 3 Drawing Sheets

TARGET ARRANGEMENT FOR MOUNTING / DISMOUNTING AND METHOD OF MANUFACTURING

Figure 1:
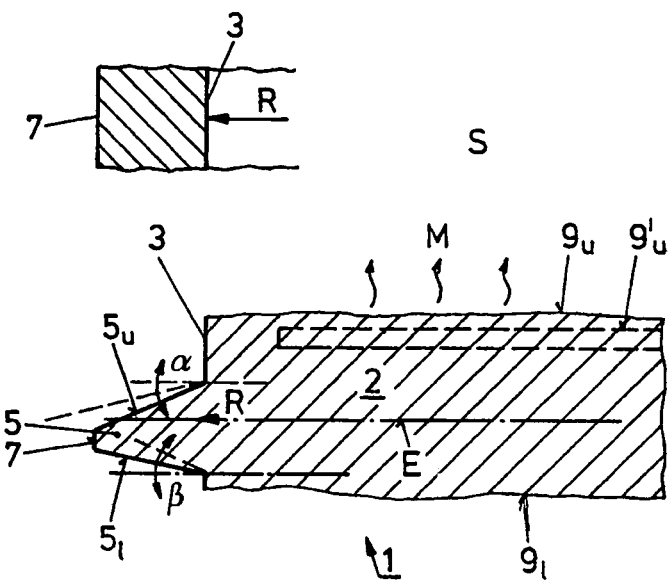

The present invention refers to a target arrangement for mounting and dismounting onto and from a material source for freeing material to a vacuum coating process and further refers to a method of manufacturing a device.

When conceiving mounting/dismounting facilities for targets for freeing material in the reaction space of a vacuum chamber so as to coat substrates with the material or with a compound derived from such material, a multitude of requirements must be considered. Thereby such considerations clearly defer for target arrangements applied for non magnetron sputtering, target arrangements applied for magnetron sputtering and target arrangements applied for cathodic arc discharge evaporation, magnetic field enhanced or without magnetic field.

Nevertheless some criteria which have to be considered are common.

One thereof is that all the mentioned target arrangements are thermally loaded heavily during operation some more locally as in cathodic arc evaporation some more uniformly as in magnetron sputtering and some rather homogeneously as in non magnetron sputtering. The primary concern with respect to thermal loading is to remove heat from such arrangements. Thereby removing of heat should be considered and optimized all along those surfaces of the addressed target arrangements which are not exposed to the reaction space in the vacuum chamber. Such surfaces open for heat removal considerations are primarily the backside of the target arrangement on one hand and the border on the other hand.

One customary technique to remove heat along the backside of target arrangements is to apply a cooling medium under pressure along the backside and establishing an optimum intimate contact between cooling medium and backside of the arrangement. Leakage of cooling medium into the reaction space is prevented by a thermally conductive, flexible foil as for instance disclosed in the U.S. Pat. No. 5,833,823.

The second area of the target arrangement to be exploited for heat removal and which additionally has to hold high mechanical loading, especially due to pressurized cooling medium, is the border area of the target arrangement. Here a most intimate and large surface contact should be established to the target arrangement so as to optimize heat flow. This border area additionally provides for accurate mount of the target arrangement to the material source.

As soon as the target arrangement is operated in magnetic field conditions, as especially in the art of magnetron sputtering, additionally, the border area of the target arrangement and the interface to the material source has to be considered under the aspect of magnetic field propagation.

This is especially valid for sputtering ferromagnetic material. The target material will act as a shunt for the flux lines of the magnetic field and thus unsufficient magnetic field may be present adjacent the target surface to form plasma channels (electron trap), which are a prerequisite for effective magnetron sputtering. Usually extremely strong magnet systems, arranged behind the ferromagnetic target, are utilized to saturate the target and in addition allow the formation of the required plasma channels on the surface of the target to be sputtered. The extremely strong attractive forces of those strong magnet systems however necessitate additional measures for safe clamping/unclamping. Moreover clamping members will also be made from ferromagnetic material to allow a defined magnetic circuit and therefore are also subject to those strong attractive forces.

From the addressed U.S. Pat. No. 5,833,823 it is known to tailor the border of a target arrangement so as to establish for a drawer-like mount/dismount of the arrangement to and from the material source. In context with proposing a target arrangement which may be inverted once the target is consumed on one side, the WO 98/03696 proposes to provide the border of the target arrangement with a semi-cylindrically shaped surface either concavely bent or convexly bent. In one embodiment, the convex semi-cylindrical border surface is biased between two clamping members. One of the clamping members is formed by the source frame to which the target arrangement is clamped the second clamped member is biased to the first one.

Prior Art has several drawbacks:

It necessitates very accurate machining of rather complex surfaces on both, the target arrangement and the clamping members to ensure intimate surface contact.

By biasing or spanning the clamping members together there is exerted a force which is just perpendicular to a plane which generically defines the extent of the target arrangement. Nevertheless such force in the addressed direction leads to a pressure distribution along the mutually contacting surfaces of the target arrangement and of the clamping members which is not homogeneous.

Thermal expansion of the target arrangement is practically blocked which may lead to warping of the target arrangement and thus to time variation of the material freeing characteristics from the target of the target arrangement.

Dismounting consumed ferromagnetic targets means to dissasemble the clamping members first and then to dismount the target. Due to the strong forces the remains tend to break and thus may damage e. g. the cooling system of the source.

Mounting a fresh ferromagnetic target also means adjusting its position prior to fastening the clamping members. Again the strong magnetic forces complicate this procedure Disassembling the magnet system before dismounting the target avoids the two a. m. problems; however this is inefficient and is detrimental to the source's uptime.

Prior Art clamping members often allow small gaps to compensate for thermal expansion. For ferromagnetic targets this however equals with an additional magnetic resistor, which affects the overall performance of the source.

It is an object of the present invention to provide a target arrangement with improved mounting/dismounting ability along its border. This is achieved by a target arrangement for mounting/dismounting onto/from a material source to free material to a vacuum coating process which comprises a plate along a plane. At least a part of the plate consists of the material to be freed for the coating process. The plate has a border, at least a predominant part of which, i.e. at least more than 50% of the border, is wedge-shaped by a first substantially, planar wedge surface angled to the addressed general plane and a second substantially planar wedge surface which is as well angled with respect to the generic plane. The first and second wedge surfaces mutually convert in a direction along the addressed plane and from a more central area of the plane perpendicular towards the border.

Thus the wedge is convex and extends interruptedly or continuously along more than 50% of the overall extent of the border of the target arrangement.

DEFINITIONS

When we speak of a "plane" along which the plate of the target arrangement extends, then we mean such plane to be defined irrespective of the shape of one or of both extended plate surfaces facing each others. If the addressed surfaces of the plate are planar and mutually parallel, then they are also parallel to the addressed plane.

A "target arrangement" which is to be mounted or dismounted to or from a material source comprises as its predominant part a target i.e. a plate like member which consists of that material which is to be freed into the process area for a coating operation. Nevertheless the target arrangement may additionally comprise further members so e.g. a backing plate or, and as will become apparent when studying the present invention, clamping members. The target arrangement is mounted and dismounted from the source as one unitary part.

When we speak of a "predominant" part of the border we mean more than 50% of the length extent of the border as considered in a top view on the target arrangement. This "predominant" part may be even up to and including 100% of the border-extent.

When we speak of "substantially" planar surfaces we address by that term that not a mathematically ideal planar surface is addressed but that such surface may depart from "planarity" as long as the effects which are reached by such surfaces are still achieved even in a less pronounced manner than would be reached with ideally planar surfaces.

By conceiving the border of the arrangement according to the present invention in wedge-shaped manner i.e. with substantially planar wedge surfaces, machining of the border surfaces is easily performed highly accurately. The same is valid for respective wedge counter surfaces at clamping members for the arrangement.

Further all the wedge surfaces and their respective counter wedge surfaces are substantially homogenously mutually pressure loaded by clamping forces which leads to optimal exploitation of such surfaces for heat conductance.

Further when clamping such border wedge of the arrangement between clamping members there occurs self positioning of the target arrangement in the clamping members. The planar-wedge clamping technique allows, within limits and dependent on the angles of the planar wedge surfaces more freedom of thermal expansion for the arrangement.

If the target arrangement is applied to a source whereat magnetic fields are generated through the target arrangement, the fact that a very accurate and intimate contact is established between the wedge surfaces and respective counter surfaces leads to optimised magnet flux homogeneity across such surfaces. This is especially advantageous for magnetron sputtering ferromagnetic material.

In one embodiment according to the present invention the addressed plate has a surface which is parallel to the plane, this surface being of the material to be freed from the target arrangement.

In a further embodiment, which is especially suited for material sources which exploit magnetic fields through the target, as especially for magnetron sources, this material to be freed is of ferromagnetic material and the addressed wedge-shaped part as well.

In a further embodiment of the invention the target arrangement comprises a first and a second clamping member respectively with a first and with a second substantially planar wedge counter surface. The first and second clamping members are biased towards each others with the first and second counter surfaces biased on to respective first and second wedge surfaces. This way the clamping members "embrace" upper and lower side of at least a part of the border region of the target. Due to the fact that the clamping members are parts of the mountable and dismountable target arrangement, they may be accurately mounted remote from a processing chamber and the overall arrangement may then easily be mounted to the source e.g. just by screwing the overall arrangement to the frame of the source: Accurate positioning and surface biasing of the wedge and the counter wedge may be performed without any time pressure so that, during respective manufacturing and whenever there is need to exchange the target arrangement this may be done quickly thereby avoiding longer interrupts of manufacturing. This is an important criterion considering overall processing- or manufacturing-throughput.

Whenever the just addressed preassembled target arrangement is to be applied in context with magnetic field enhanced coating, especially in context with magnetron sputtering, the addressed clamping members as well as the wedge-shaped part are made of ferromagnetic material. This especially if the target too is of ferromagnetic material.

In such case a preassembled new target arrangement can be lowered onto the source without adjusting target and clamping member separately. A consumed target arrangement can be dismounted and by handling it from the clamping side, breakage of the target can be avoided.

In a further embodiment of the arrangement according to the invention the wedge surfaces are substantially equally angled to the addressed plane.

The method according to the present invention comprises the steps of mounting a target arrangement with a target with a wedged border and with clamping members of magnetic material to a magnetron source within a vacuum chamber, positioning at least one substrate with a surface to be coated facing towards the mounted target arrangement and magnetron sputter coating this surface.

Thereby in one embodiment a device manufactured by such method is a read head, a write head, a read/write head, all for storage disks, a magnetic data storage disk or a semiconductor device.

Figure 2:
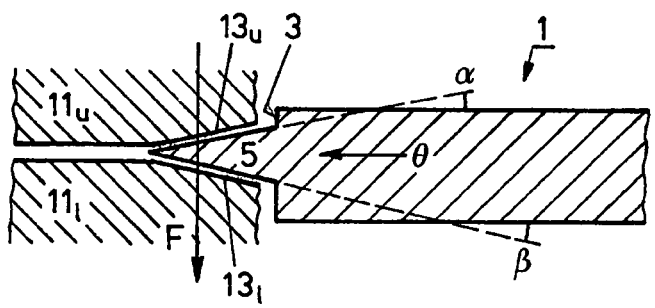
Figure 3:
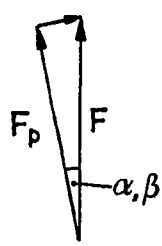
Figure 3:
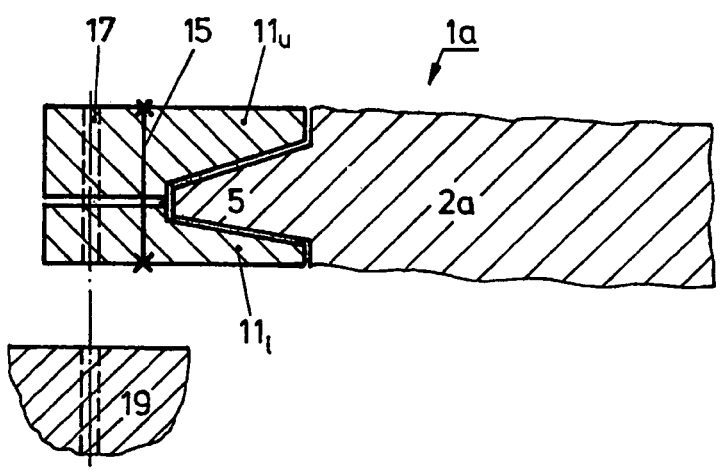
Figure 4:
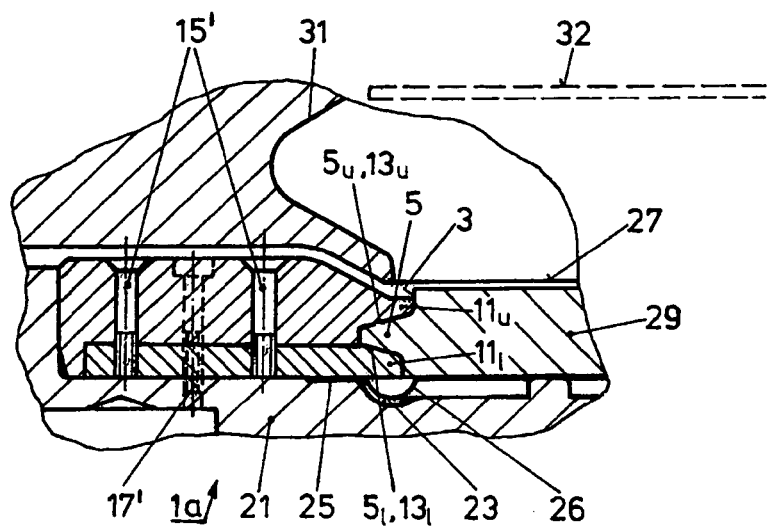
Figure 5:
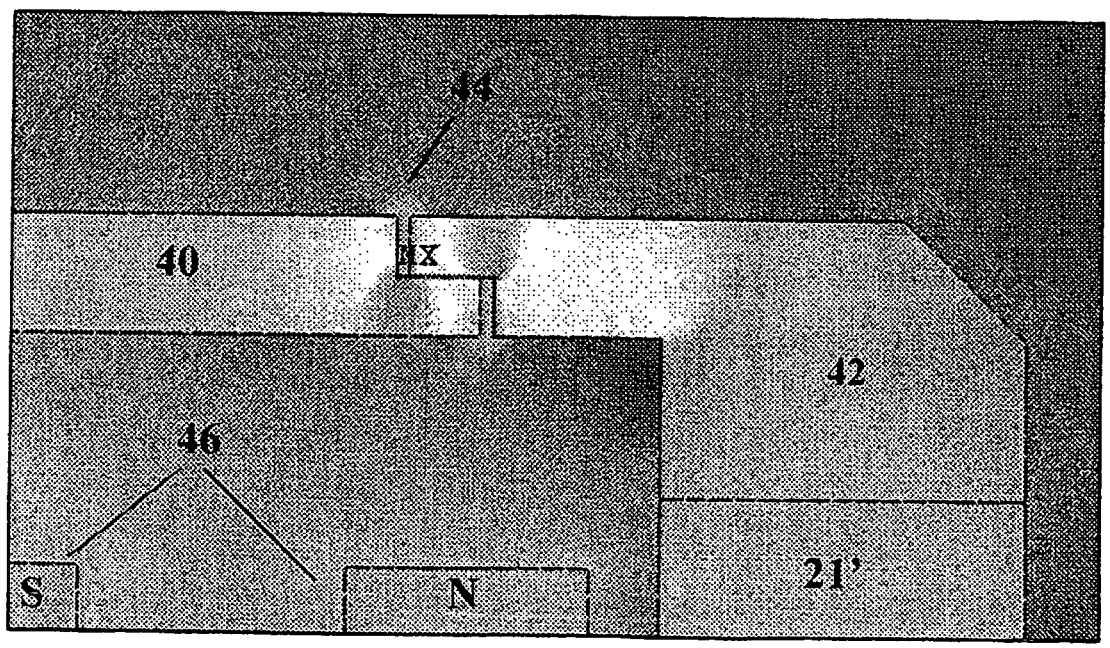
Figure 6:
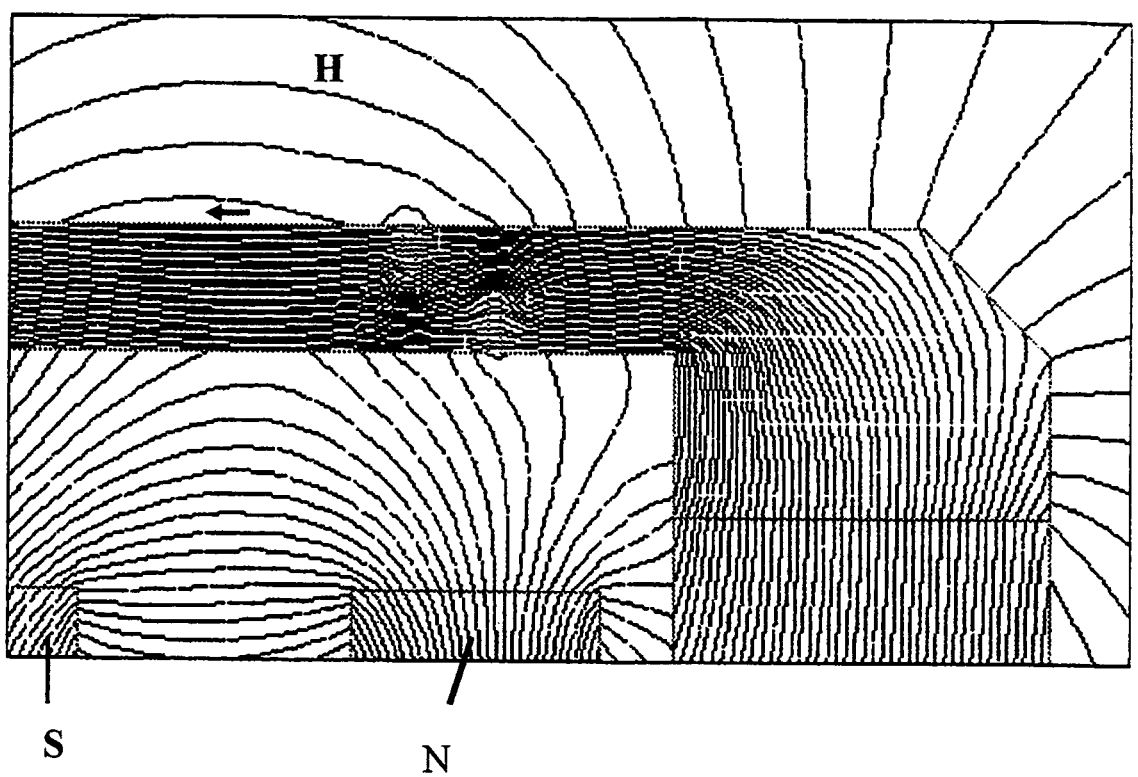

The invention shall now be further described by means of examples and with a help of figures. The figures show:

FIG. 1: Schematically a border part of a target arrangement according to the invention;

FIG. 2: Still schematically, the target arrangement according to FIG. 1 with clamping members;

FIG. 3: Still in a representation according to that of FIG. 1 a further embodiment of a target arrangement according to the invention;

FIG. 4: A part of a vacuum chamber with a material source and, mounted thereon, a target arrangement according to the invention facing a substrate to be coated;

FIG. 5: Schematically prior art clamping of a target of ferromagnetic material to a magnetron source;

FIG. 6: A magnetic flux line pattern as calculated by a finite element method and showing magnetic field leakage due to inaccurate transition from clamping member to target at the prior art embodiment of FIG. 5.

According to FIG. 1 a target arrangement 1 according to the present invention comprises a plate member 2 which extends along a plane E. The entire plate 2 or, as shown in dash line, a part of plate 2, consists of a material M which is intended to be freed by action of a material source into the processing space S of a vacuum chamber (not shown). Such processing may be non-magnetron sputtering, magnetron sputtering, cathodic arc evaporation, all reactive or non reactive. If the plate 2 itself consists of the addressed material M, such plate is formed by the target. If on the other hand and as shown in dash lines, a target is mounted to additional members as e.g. to a back plate the target arrangement comprises beside of the target additional members.

The target arrangement 1 is surrounded by a border 3. The arrangement 2 may be circular, annular or rectangular. The border 3 is wedge-shaped as shown by wedge 5 along a predominant part of its extent. This wedge-shape is formed by a first wedge surface $5_u$ and a second wedge surface $5_l$. Both wedge surfaces $5_u$ and $5_l$ are substantially planar. They define with respect to plane E respective angles α and β. The first and second wedge surfaces mutually convert in the direction R defined along plane E and from the center of the arrangement 1 perpendicularly towards the border 3, as shown in the representation on top of FIG. 1.

The angles α and β may be equal or different. The first and second wedge surfaces $5_u$, $5_l$ need not to intersect and thereby to form a sharp wedge edge. The corner of wedge 5 may be truncated to a larger or smaller amount to form periphery surface 7. Further, opposing surfaces $9_u$, and $9_l$ of the plate 2 need not to be parallel to plane E as generically shown in FIG. 1. In practice at least before being eroded by device manufacturing, that surface wherefrom material is freed to the process area S, is a surface which is substantially planar and substantially parallel to E. Such target surface $9_u'$ is shown in FIG. 1 in dash line. With respect to the angles α and β it has to be noted that neither α nor β need to be constant all along the border 3 the angles may locally vary e.g. as a function of locally varying mechanical and/or thermal loading.

A good embodiment is an embodiment in which, even if locally varying along the extent of the border 3, the angles α and β are conceived at least approximately equal.

The effect of the values of the angles α and β shall be explained with the help of FIG. 2.

According to FIG. 2 the target arrangement 1 has at the border 3 an angularly symmetric wedge 5, α and β being equal. A first clamping member $11_u$ has a first counter wedge surface $13_u$. A second clamping member $11_l$ has a second counter wedge surface $13_l$.

The effect of a biasing force F shall be explained mutually biasing the two clamping members $11_u$ and $11_l$. As shown in the vector diagram of FIG. 2 the respective pairs of wedge surface/counter wedge surface are equally biased with the force F leading to a substantially equal pressure distribution along these surfaces. Given a biasing force or clamping force F between the clamping members, the resulting pressure at the respective first and second pairs of surfaces is substantially dominated by the value of the respective angles α and β. Further it may be seen that whenever the target arrangement 1 thermically expands as shown by arrow θ, on one hand the biasing pressure at both surface pairs is equally increased if α is selected equal to β and, on the other hand, such thermal expansion will be absorbed at the respective pairs of wedge surface/counter wedge surface to a certain amount thereby reducing warping of the surface freeing material M during operation.

In FIG. 3 there is shown in a representation analogous to that of FIG. 1, a further embodiment of the present invention. Here the target arrangement 1a consists of a target plate 2a and an upper and a lower clamping member $11_u$ and $11_l$ as were introduced in context with FIG. 2.

The clamping members $11_u$ and $11_l$ are mounted and biased to the wedge 5, as schematically shown in FIG. 3, by a biasing members 15 e.g. by screws.

The overall arrangement 1a has further mounting facilities as e.g. screw holes 17, so that the arrangement 1a as a unitary part may be mounted or dismounted to and from a material source at the vacuum chamber and as schematically shown at 19. Thus and according to the embodiment of FIG. 3 the accurate mount of the clamping members $11_u$ and $11_l$ to the wedge 5 of the arrangement 1 may easily be performed separate and remote from the processing chamber and the target arrangement 1a once assembled is easily mounted to the material source. Thereby the more critical assembling of the plate 2a to the clamping members $11_{u,l}$ does not influence interruption time of manufacturing for replacement of the target arrangement. This is especially valid for ferromagnetic targets in view of the strong magnetic forces present.

In FIG. 4 there is shown, in cross section, a part of a vacuum chamber for sputter coating a substrate. A material source comprises a frame 21 with a cooling medium system 23. The cooling medium system 23 is sealingly closed by means of a flexible foil 26 towards a receiving space 27 for a target arrangement 1a. The target arrangement of the embodiment of FIG. 4 is principally conceived as was explained with a help of FIG. 3. The arrangement 1a is formed by target 29 with the border wedge 5 all around border 3. First and second clamping members $11_u$ and $11_l$ are mutually biased together by means of screws 15', so that the first and second counter wedge surfaces $13_u$ and $13_l$ are gently biased towards respective first and second wedge surfaces $5_u$ and $5_l$ of target 29.

The overall arrangement 1a of target 29 and assembled clamping members 11 is mounted to the frame 21 of the source by screws 17'. Reference number 31 denotes a shielding member of the vacuum chamber towards a substrate 32 to be sputter coated by the material source with the target arrangement 1a.

In FIG. 5 there is schematically shown a prior art arrangement with a target 40 and a clamping arrangement 42 whereby, as schematically shown, clamping action of member 42 on target 40 leads to small gaps 44 left open at the interface 40/42.

There is further shown a magnet arrangement 46 of the source thus being a magnetron sputter source. The material of target 40 as well as the material of clamping member 42 and of the frame 21' of the source is ferromagnetic. FIG. 6 shows that the magnetic flux lines, of the arrangement of FIG. 5, and as simulated by finite element technique, reveal magnetic field leakage above gaps 44.

Such magnetic field leakage is significantly reduced by applying the planar wedge/counter wedge approach according to the present invention. Thus with an eye on the embodiment of FIG. 4 it is especially suited for magnetron sputtering of a target 29 of ferromagnetic material whereby, in such case, the two clamping members $11_u$ and $11_l$ and even possibly the screws 15' are made of ferromagnetic material beside at least parts of frame 21.

In spite of the fact, that also for magnetron sputtering non ferromagnetic target material, the controlled intimate transition from the target arrangement to the clamping members will lead to less magnetic field distortion, the present invention is especially suited for magnetron sputtering ferromagnetic target materials which is per se difficult in view of the fact that such material shunts a significant part of the magnetic field generated by the magnet arrangement of the source.

The target arrangement exemplified with a target of ferromagnetic materials and clamping members of ferromagnetic material, is most suited in a method of manufacturing a device by magnetron sputtering ferromagnetic material, thereby especially for manufacturing read heads, write heads, read/ write heads for storage disks or for manufacturing magnetic data storage disks or semiconductor devices.

The invention claimed is:

1. A material source comprising a removable target arrangement,
   the target arrangement comprising a plate, separable first and second clamping means, and at least one clamp biasing member for biasing the first and second clamping means towards each other to clamp part of the plate therebetween,
   wherein said target arrangement can be mounted and dismounted as a unitary part onto and off of said material source, the target arrangement of the material source being provided to free material to a vacuum coating process,
   wherein the plate of said target arrangement is provided along a plane, at least a predominant part of an outer border of said plate being wedge-shaped by a first substantially planar wedge surface angled to said plane and a second substantially planar wedge surface angled to said plane, said first and second wedge surfaces mutually converging in a direction along said plane and from a central area of said plate perpendicularly towards said outer border of said plate, the first and second clamping means are respectively provided with a first and a second substantially planar wedge counter surface, and said first and second clamping means being biased towards each other with said first and second wedge counter surfaces biased towards and on said first and second wedge surfaces, the clamp biasing member exerting a force which is generally perpendicular to the plane and which creates a pressure between said wedge surfaces and counter surfaces to thereby clamp the plate, and
   wherein the target arrangement, including the first and second clamping means, the plate clamped by the clamping means, and the at least one clamp biasing member, is releasably mounted to a frame of said material source by at least one frame mounting element,
   wherein the frame mounting element and the clamp biasing member are distinct and independently releasable elements, and
   wherein the frame mounting element is releasably connected to the frame of the material source and the clamp biasing member is not directly connected to the frame of the material source.

2. The arrangement of claim 1 wherein said plate has a surface parallel to said plane which is of said material.

3. The arrangement of claim 1, wherein said plate is a target.

4. The arrangement of claim 1, wherein said part of said outer border of said plate is of ferromagnetic material.

5. The arrangement of claim 4, wherein said material to be freed is ferromagnetic material.

6. The arrangement of claim 1, being a sputter target arrangement.

7. The arrangement of claim 1, wherein said first and second wedge surfaces are substantially equally angled to said plane.

8. A method of manufacturing a device including the step of applying at least one layer comprising a ferromagnetic material on a substrate, comprising the steps of:
   mounting a target arrangement to a magnetron source, within a vacuum chamber, said target arrangement comprises a plate along a plane, with separable first and second clamping means, and at least one clamp biasing member for biasing said clamping means towards each other, wherein at least a predominant part of an outer border of said plate is wedge-shaped having a first substantially planar wedge surface angled to said plane and a second substantially planar wedge surface angled to said plane, said first and second wedge surfaces mutually converging in a direction along said plane and from a central area of said plate perpendicularly towards said outer border of said plate,
   clamping said first and second wedge surfaces of the plate border by biasing said first and second clamping means provided with a first and a second substantially planar wedge counter surface, and said first and second clamping means being biased towards each other by the at least one clamp biasing member with the first and second wedge counter surfaces biased towards and on said first and second wedge surfaces, positioning at least one substrate with a surface to be coated facing towards said mounted target arrangement, said target arrangement, including said plate, said clamp biasing member, and said clamping means, being releasably mounted to a frame of the magnetron source by at least one frame mounting element which is distinct and separately operable from the at least one clamp biasing member, and
   sputter coating said substrate.

9. The method of claim 8, said device being one of a read head, a write head, a read/write head, all for storage disks, a magnetic data storage disc, or a semiconductor device.

10. A magnetron sputter source comprising a target arrangement according to claim 4, and a magnet arrangement generating a magnetic field upon said target arrangement.

11. The arrangement of claim 1 wherein the first and second clamping means are adjustably biased towards said first and second wedge surfaces of said outer border of said plate.

12. The method of claim 8 wherein the first and second clamping means are adjustably biased towards said first and second wedge surfaces of said outer border of said plate.

* * * * *